United States Patent
Cheng et al.

(10) Patent No.: US 9,064,688 B2
(45) Date of Patent: Jun. 23, 2015

(54) PERFORMING ENHANCED CLEANING IN THE FORMATION OF MOS DEVICES

(75) Inventors: Yu-Hung Cheng, Hsin-Chu (TW);
Wu-Ping Huang, Hsin-Chu (TW);
Chii-Horng Li, Zhubei (TW);
Tze-Liang Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 128 days.

(21) Appl. No.: 13/427,628

(22) Filed: Mar. 22, 2012

(65) Prior Publication Data

US 2013/0252392 A1 Sep. 26, 2013

(51) Int. Cl.
| | |
|---|---|
| H01L 21/336 | (2006.01) |
| H01L 21/76 | (2006.01) |
| H01L 21/311 | (2006.01) |
| H01L 21/302 | (2006.01) |
| H01L 21/461 | (2006.01) |
| H01L 21/02 | (2006.01) |
| H01L 21/3065 | (2006.01) |
| H01L 21/8234 | (2006.01) |
| H01L 21/8238 | (2006.01) |
| H01L 29/66 | (2006.01) |

(Continued)

(52) U.S. Cl.
CPC .... *H01L 21/02057* (2013.01); *H01L 21/02661* (2013.01); *H01L 21/3065* (2013.01); *H01L 21/823412* (2013.01); *H01L 21/823425* (2013.01); *H01L 21/823807* (2013.01); *H01L 21/823814* (2013.01); *H01L 21/02381* (2013.01); *H01L 21/0243* (2013.01); *H01L 21/02532* (2013.01); *H01L 21/02639* (2013.01); *H01L 29/66636* (2013.01); *H01L 29/7848* (2013.01); *H01L 29/165* (2013.01)

(58) Field of Classification Search
None
See application file for complete search history.

(56) References Cited

U.S. PATENT DOCUMENTS

| | | | |
|---|---|---|---|
| 8,299,564 | B1 | 10/2012 | Wu et al. |
| 8,647,953 | B2 | 2/2014 | Liao et al. |
| 2001/0045604 | A1 | 11/2001 | Oda et al. |

(Continued)

FOREIGN PATENT DOCUMENTS

| | | |
|---|---|---|
| CN | 1988110 | 6/2007 |
| TW | 200731362 | 8/2007 |

OTHER PUBLICATIONS

Ito, S., et al., "Pattern dependence in selective epitaxial $Si_{1-x}Ge_x$ growth using reduced-pressure chemical vapor deposition," J. Appl. Phys. 78 (4), Aug. 15, 1995, American Institute of Physics, pp. 2716-2719.

(Continued)

*Primary Examiner* — Mamadou Diallo
*Assistant Examiner* — Jay C Chang
(74) *Attorney, Agent, or Firm* — Slater & Matsil, L.L.P.

(57) ABSTRACT

A method includes etching a semiconductor substrate to form a recess, wherein the recess extends from a top surface of the semiconductor substrate into the semiconductor substrate. An enhanced cleaning is then performed to etch exposed portions of the semiconductor substrate. The exposed portions are in the recess. The enhanced cleaning is performed using process gases including hydrochloride (HCl) and germane ($GeH_4$). After the enhanced cleaning, an epitaxy is performed to grow a semiconductor region in the recess.

20 Claims, 13 Drawing Sheets

(51) Int. Cl.
*H01L 29/78* (2006.01)
*H01L 29/165* (2006.01)

(56) References Cited

U.S. PATENT DOCUMENTS

| | | | |
|---|---|---|---|
| 2005/0079691 A1 | 4/2005 | Kim et al. | |
| 2006/0038243 A1* | 2/2006 | Ueno et al. | 257/408 |
| 2006/0057821 A1* | 3/2006 | Lee et al. | 438/459 |
| 2006/0138398 A1 | 6/2006 | Shimamune et al. | |
| 2006/0151776 A1* | 7/2006 | Hatada et al. | 257/19 |
| 2007/0045729 A1 | 3/2007 | Hoentschel et al. | |
| 2007/0054457 A1* | 3/2007 | Ueno et al. | 438/299 |
| 2007/0096419 A1 | 5/2007 | Gercke et al. | |
| 2007/0105331 A1 | 5/2007 | Murthy et al. | |
| 2007/0131159 A1 | 6/2007 | Kim et al. | |
| 2007/0148919 A1 | 6/2007 | Lin et al. | |
| 2007/0190730 A1 | 8/2007 | Huang et al. | |
| 2007/0235802 A1 | 10/2007 | Chong et al. | |
| 2008/0023773 A1 | 1/2008 | Shimamune et al. | |
| 2008/0233722 A1 | 9/2008 | Liao et al. | |
| 2008/0237634 A1* | 10/2008 | Dyer et al. | 257/190 |
| 2008/0242037 A1 | 10/2008 | Sell et al. | |
| 2008/0277699 A1* | 11/2008 | Chakravarthi et al. | 257/289 |
| 2009/0075029 A1 | 3/2009 | Thomas et al. | |
| 2009/0101942 A1 | 4/2009 | Dyer | |
| 2009/0258463 A1 | 10/2009 | Kim et al. | |
| 2009/0283837 A1 | 11/2009 | Huebinger et al. | |
| 2010/0035419 A1 | 2/2010 | Dube et al. | |
| 2010/0093147 A1 | 4/2010 | Liao et al. | |
| 2010/0105184 A1* | 4/2010 | Fukuda et al. | 438/299 |
| 2010/0148217 A1 | 6/2010 | Simonelli et al. | |
| 2010/0167505 A1 | 7/2010 | Chew et al. | |
| 2010/0264470 A1* | 10/2010 | Thirupapuliyur et al. | 257/288 |
| 2010/0295127 A1* | 11/2010 | Cheng et al. | 257/347 |
| 2011/0008951 A1 | 1/2011 | Chen et al. | |
| 2011/0108894 A1* | 5/2011 | Sung et al. | 257/288 |
| 2011/0117732 A1 | 5/2011 | Bauer et al. | |
| 2011/0287600 A1 | 11/2011 | Cheng et al. | |
| 2011/0287611 A1 | 11/2011 | Cheng et al. | |

OTHER PUBLICATIONS

Bodnar, S., et al., "Selective Si and SiGe epitaxial heterostructures grown using an industrial low-pressure chemical vapor deposition module," J. Vac. Sci. Technol. B 15 (3), May/Jun. 1997, American Vacuum Society, pp. 712-718.

Menon, C., et al., "Loading effect in SiGe layers grown by dichlorosilane- and silane-based epitaxy," J. Appl. Phys. 90 (9), Nov. 1, 2001, American Institute of Physics, pp. 4805-4809.

Isheden, C., et al., "MOSFETs with Recessed SiGe Source/Drain Junctions Formed by Selective Etching and Growth," Electrochemical and Solid-State Letters, 7 (4), 2004, pp. G53-G55.

* cited by examiner

PERFORMING ENHANCED CLEANING IN THE FORMATION OF MOS DEVICES

CROSS-REFERENCE TO RELATED APPLICATIONS

This application relates to the following commonly-assigned U.S. patents: U.S. patent application Ser. No. 13/030,850, filed Feb. 18, 2011, and entitled "Reducing Variation by Using Combination Epitaxy Growth;" and U.S. patent application Ser. No. 12/784,344, filed on May 20, 2010, and entitled "Selective Etching in the Formation of Epitaxy Regions in MOS Devices," which applications are hereby incorporated herein by reference.

BACKGROUND

To enhance the performance of Metal-Oxide-Semiconductor (MOS) devices, stress may be introduced in the channel regions of the MOS devices to improve carrier mobility. Generally, it is desirable to induce a tensile stress in the channel region of an N-type MOS ("NMOS") device in a source-to-drain direction, and to induce a compressive stress in the channel region of a P-type MOS ("PMOS") device in a source-to-drain direction.

A commonly used method for applying compressive stress to the channel regions of PMOS devices is growing SiGe stressors in the source and drain regions. Such a method typically includes the steps of forming a gate stack on a silicon substrate, forming spacers on sidewalls of the gate stack, forming recesses in the silicon substrate and adjacent the gate spacers, and epitaxially growing SiGe stressors in the recesses. An annealing is then performed. Since SiGe has a greater lattice constant than silicon, it expands after annealing and applies a compressive stress to the channel region of the respective MOS device, which is located between a source SiGe stressor and a drain SiGe stressor. Similarly, the stress to the channel regions of NMOS devices may be achieved by forming SiC stressors.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 6A through 14 are cross-sectional views and top views of intermediate stages in the formation of recesses and epitaxy regions in accordance with some alternative exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A method of forming a Metal-Oxide-Semiconductor (MOS) device comprising a stressor is provided in accordance with various exemplary embodiments. The intermediate stages of forming the MOS device are illustrated. The variations of the embodiments are then discussed. Throughout the various views and illustrative embodiments, like reference numbers are used to designate like elements.

Figure 1:
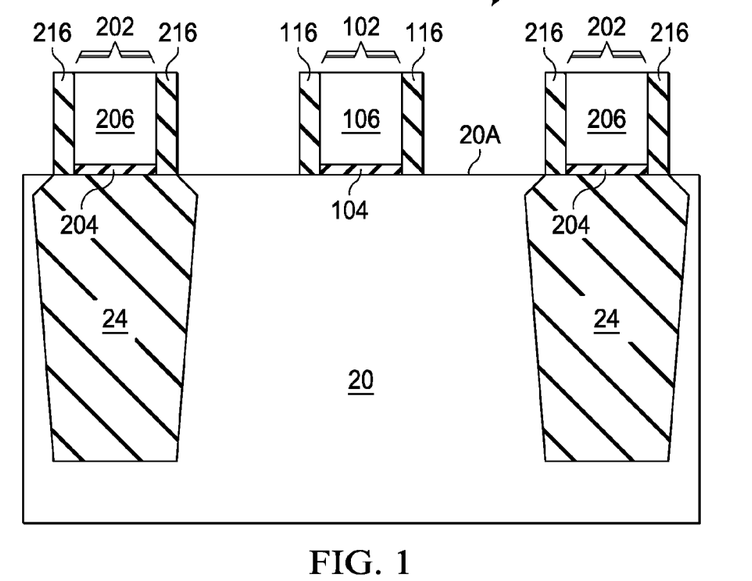
FIGS. 1 through 5 are cross-sectional views and a top view of intermediate stages in the manufacturing of a Metal-Oxide-Semiconductor (MOS) device in accordance with some exemplary embodiments.

FIGS. 1 through 5 illustrate cross-sectional views of intermediate stages in the formation of a MOS device in accordance with some exemplary embodiments. FIG. 1 illustrates substrate 20, which may be a portion of wafer 22. Substrate 20 may comprise a bulk semiconductor material such as crystalline silicon. Alternatively, substrate 20 may have a composite structure such as a Silicon-On-Insulator (SOI) structure. In some embodiments, substrate 20 may be a (100) or a (001) substrate. Accordingly, top surface 20A of substrate 20 may have a (100) or a (001) surface orientation, although substrate 20 may have other surface orientations. Shallow Trench Isolation (STI) regions 24 are formed in substrate 20.

Gate stack 102, which includes gate dielectric 104 and gate electrode 106, is formed over substrate 20. Dummy Gate stacks 202, which include dummy gate dielectrics 204 and dummy gate electrodes 206, are formed over STI regions 24. Gate dielectric 104 and dummy gate dielectrics 204 may include silicon oxide or high-k materials having high k values, for example, higher than about 7. Gate electrodes 106 and dummy gate electrodes 206 may include commonly used conductive materials such as doped polysilicon, metals, metal silicides, metal nitrides, and combinations thereof. In some embodiments, Lightly Doped Drain/source (LDD) regions (not shown) may be formed, for example, by implanting into substrate 20 with a p-type impurity or an n-type impurity, depending on the desirable conductivity type of the resulting MOS device. Gate stack 102 acts as the implantation mask, so that the inner edges of the LDD regions are substantially aligned with the edges of gate stack 102.

Furthermore, gate spacers 116 and dummy gate spacers 216 are formed on the sidewalls of gate stacks 102 and dummy gate stack 202, respectively. In some embodiments, each of gate spacers 116 and 216 includes a liner oxide layer and a nitride layer over the liner oxide layer. In alternative embodiments, each of gate spacers 116 and 216 may include one or more layers, each comprising oxide, silicon nitride, silicon oxynitride (SiON) and/or other dielectric materials. The formation of gate spacers 116 and 216 may include blanket forming gate spacer layers, and then performing etching steps to remove the horizontal portions of the gate spacer layers, so that the remaining vertical portions of the gate spacer layers form gate spacers 116 and 216.

Figure 2A:
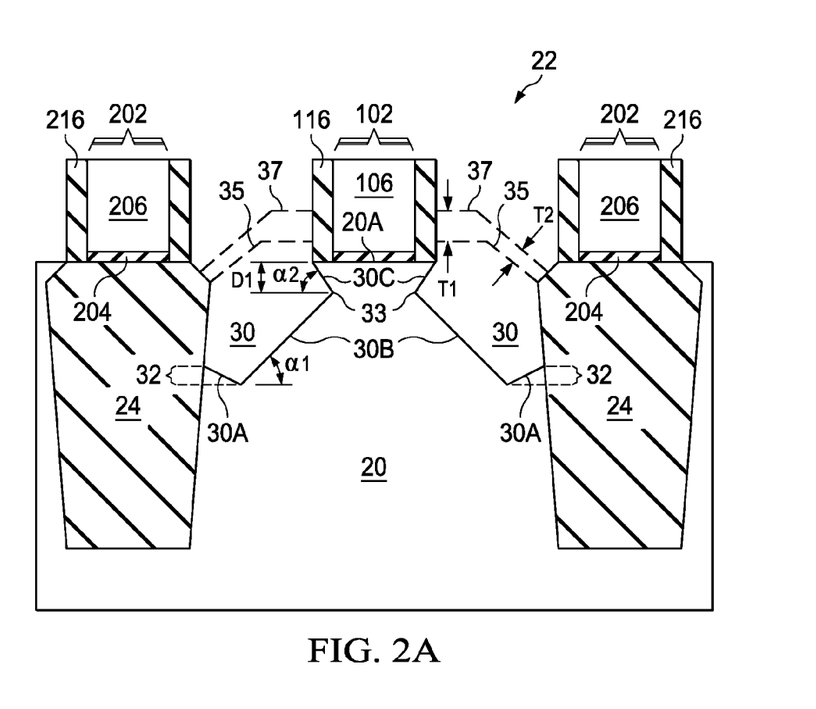
Figure 2B:
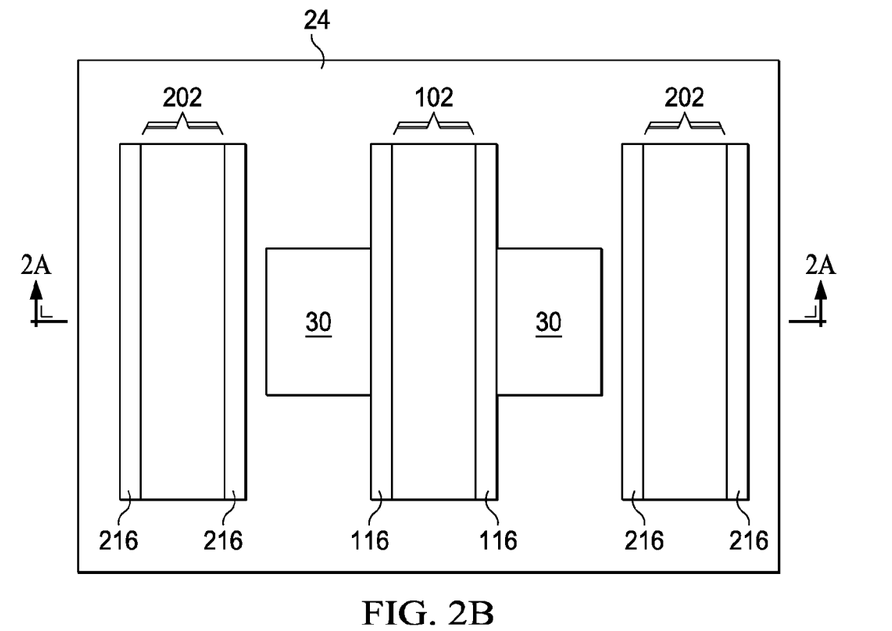

Referring to FIG. 2A, recesses 30 are formed through the etching of substrate 20. The formation of recesses 30 may include performing an anisotropic etching to etch into substrate 20, and then performing a wet etching by dipping wafer 22 into an etching solution such as a tetra-methyl ammonium hydroxide (TMAH) solution. In some embodiments, the exposed surfaces 30A, 30B, and 30C (of substrate 20) in recesses 30 are pinned to (111) surfaces, or close to (111) surfaces, since (111) surfaces are stable surfaces and have a smaller etching rate than some other surfaces. Angles α1 and α2 may be equal to or greater than 54.7 degrees, wherein angle α1 is formed between surface 30B and a horizontal plane parallel to top surface 20A of substrate 20, and angle α2 is formed between surface 30C and a horizontal plane parallel to top surface 20A. Surfaces 30A are in contact with the sidewalls of STI regions 24. FIG. 2B illustrates a top view of the structure shown in FIG. 2A, wherein the cross-sectional view shown in FIG. 2A is obtained from the plane crossing line 2A-2A in FIG. 2B.

Figure 3:
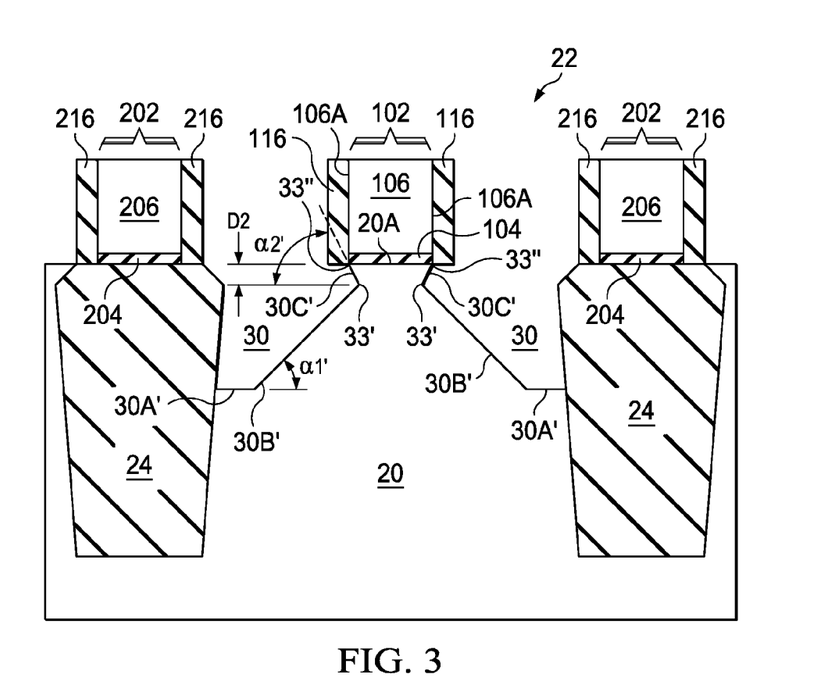

Referring to FIG. 3, an enhanced cleaning step is performed. In some embodiments, the enhanced cleaning step is performed in a same chamber used for growing epitaxy regions 34 (not shown in FIG. 3, please refer to FIG. 4) in recesses 30. The etching gases for the enhanced cleaning may include HCl and germane (GeH$_4$). Other gases such as Dichloro-Silane (DCS), silane (SiH$_4$), methylsilane (SiCH$_6$), and/or the like may also be included in the etching gases. The enhanced cleaning may be performed in a chamber that is configured to perform Low Pressure Chemical Vapor Deposition (LPCVD). In some embodiments, the total pressure of the etching gases may be between about 1 Torr and about 500 Torr. The temperature of wafer 22 during the enhanced cleaning may be between about 500° C. and about 750° C. The etching time may be between about 10 seconds and about 300 seconds. Since the etching gases include germane and possibly DCS, SiH$_4$, SiCH$_6$, and/or the like, at the same time the enhanced cleaning is performed by HCl, a growing effect also occurs, and the net effect is the etching since the etching rate is greater than the growth rate. In addition, the net etching rate of the portion of (111) crystal surface near STI regions 24 and gate dielectric 104 is greater than the etching rate on (001) surface.

To determine the optimum conditions for the enhanced cleaning, an etch-back to growth ratio (also referred to as Etch-to-Growth ratio, or E/G ratio) may be used to define the process conditions. The E/G ratio is the ratio of the partial pressure of etch-back gas(es) (such as HCl) to the weighted partial pressure of the growth gas(es) (such as GeH$_4$ and DCS). In an exemplary embodiment in which HCl, GeH$_4$, and/or DCS are used, the E/G ratio may be expressed as:

$$E/G\ \text{ratio}=P_{HCl}/(P_{DCS}+100\times P_{GeH4}) \quad [\text{Eq. 1}]$$

With $P_{HCl}$, $P_{DCS}$, and $P_{GeH4}$ being the partial pressures of HCl, DCS, and GeH$_4$, respectively. The value "100" represents an estimated weight of GeH$_4$. The accurate estimated weight of GeH$_4$ may need to be found through experiments. The weight "100" indicates the effect of GeH$_4$ over DCS, although an actual weight may be slightly different.

Alternatively, the E/G ratio may be expressed using flow rates of the process gases:

$$E/G\ \text{ratio}=FR_{HCl}/(FR_{DCS}+100\times FR_{GeH4}) \quad [\text{Eq. 2}]$$

With $FR_{HCl}$, $FR_{DCS}$, and $FR_{GeH4}$ being the flow rates of HCl, DCS, and GeH$_4$, respectively. The value "100" again represents an estimated weight of GeH$_4$. The accurate estimated weight of GeH$_4$ may need to be found through experiments. At a constant temperature and a constant total volume of HCl, DCS, and GeH$_4$, Equations 1 and 2 are equivalent. Alternatively stated, if the temperature and the total volume of HCl, DCS, and GeH$_4$ are constant, the E/G ratio expressed using Equation 1 may be converted to (or from) the E/G ratio expressed using Equation 2 by simply changing the symbols "P" to (or from) the symbols "FR." If, however, the temperature and/or the total volume are not constant, the E/G ratio expressed using Equation 1 may not be converted to (or from) the E/G ratio expressed using Equation 2 by simply changing the symbols "P" to (or from) the symbols "FR," and further modification, such as the modification of the estimated weight of GeH$_4$ may be needed. Furthermore, if the temperature and/or the total volume are not constant, the E/G ratio calculated using Equation 1 may be slightly different from the E/G ratio calculated using Equation 2.

As a result of the enhanced cleaning, portions 32 of substrate 20 (FIG. 2A) are removed from the bottoms of recesses 30. Accordingly, the exposed surfaces of substrate 20 include surfaces 30A', which are parallel to, or substantially parallel to, top surface 20A of substrate 20. In addition, as a result of the enhanced cleaning, surfaces 30B and 30C as in FIG. 2A are also recessed, forming surfaces 30B' and 30C', respectively. Surfaces 30C' are recessed more toward the direction directly under gate electrode 106 than surfaces 30C. Top points 33'' of surfaces 30C' may be substantially aligned to the respective edges of gate electrode 106. Top points 33' are substantially level with the bottom surface of gate dielectric 104. The recessing of surfaces 30C has two effects. First, the subsequently formed stressors 34 (FIG. 4) are closer to the edges of gate electrode 106. Second, depth D2 of tip 33' is smaller than depth D1 of tips 33 (FIG. 2A). Both effects result in the increase in the stress applied by stressors 34 (FIG. 4), and the increase in the drive current of the resulting MOS device.

In FIG. 3, angles α1' and α2' are substantially equal to 54.7 degrees. Angle α1' is formed between surfaces 30B' and a horizontal plane parallel to top surface 20A of substrate 20. Angle α2' is formed between surfaces 30C' and a horizontal plane parallel to top surface 20A of substrate 20.

Figure 4:
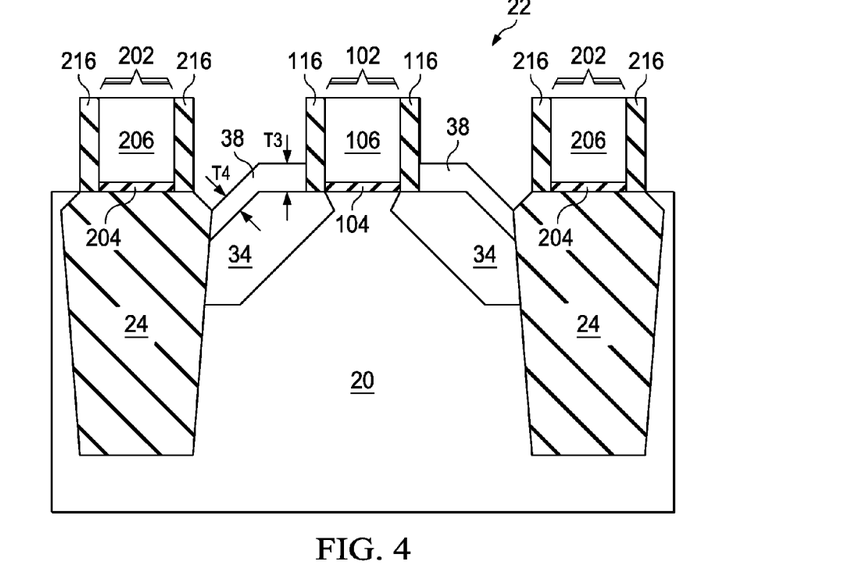

In subsequent process steps, as shown in FIG. 4, a semiconductor material, such as silicon germanium (SiGe), silicon carbon (SiC), or the like, is epitaxially grown in recesses 30 by a selective epitaxial growth (SEG). As a result, epitaxy regions 34 are formed. Epitaxy regions 34 may include silicon germanium if the resulting MOS device is a PMOS device. Alternatively, epitaxy regions 34 may include silicon carbon if the resulting MOS device is an NMOS device. The semiconductor material may also be substantially pure silicon with no germanium or carbon added therein. The epitaxy may be in-situ performed in the same process chamber as for performing the enhanced cleaning. Accordingly, there may be no vacuum break between the enhanced cleaning and the epitaxy. The epitaxy may be performed using LPCVD, for example. The process gases may include DCS, germane, HCl, and/or the like, depending on the forming material of epitaxy regions 34. Epitaxy regions 34 may have a greater or a smaller lattice constant than substrate 20. Desired impurities may be, or may not be, doped in epitaxy regions 34 when the epitaxial growth proceeds. After being annealed, epitaxy regions 34 will try to restore its lattice constant, thus introducing a compressive stress or a tensile stress to the channel regions of the resulting MOS devices. Epitaxy regions 34 are hence referred to as stressors 34 hereinafter.

FIG. 4 also illustrates the formation of silicon-containing caps 38, which may be silicon caps, silicon germanium caps, or silicon carbon caps. Silicon-containing caps 38 may also be formed using selective epitaxial growth. When germanium (or carbon) is contained in silicon-containing caps 38, the germanium (or carbon) atomic percentage in silicon-containing caps 38 may be lower than the germanium (or carbon) atomic percentage in the underlying stressors 34.

Due to the enhanced cleaning, the additional silicon regions 32 (FIG. 2A) are removed from the bottoms of recesses 30 (FIG. 3). As are result, the profile of stressors 34 are changed, and the top surfaces of stressors 34 become flatter than when no enhanced cleaning is performed. Consequently, the profile of silicon-containing caps 38 is changed, and the thickness of silicon-containing caps 38 becomes more uniform. For example, FIG. 2A schematically illustrates that if no enhanced cleaning is performed, the top surfaces of stressors 34 and silicon-containing caps 38 will be at the positions of the dashed lines 35 and 37, respectively. Accordingly, thickness T2 of caps 38 may be much smaller than thickness T1 of caps 38, and thickness T2 may be smaller than about 10 nm. This causes problems for the subsequent silicide formation. As a comparison, as shown in FIG. 4, thicknesses T3 and T4 of silicon-containing caps 38 are substantially equal to each other. Thickness T4 may accordingly be greater than 10 nm without requiring thickness T3 to be increased too much. In addition, thicknesses T4 in different MOS devices throughout wafer 22 may be more uniform when the enhanced cleaning is performed.

Figure 5:
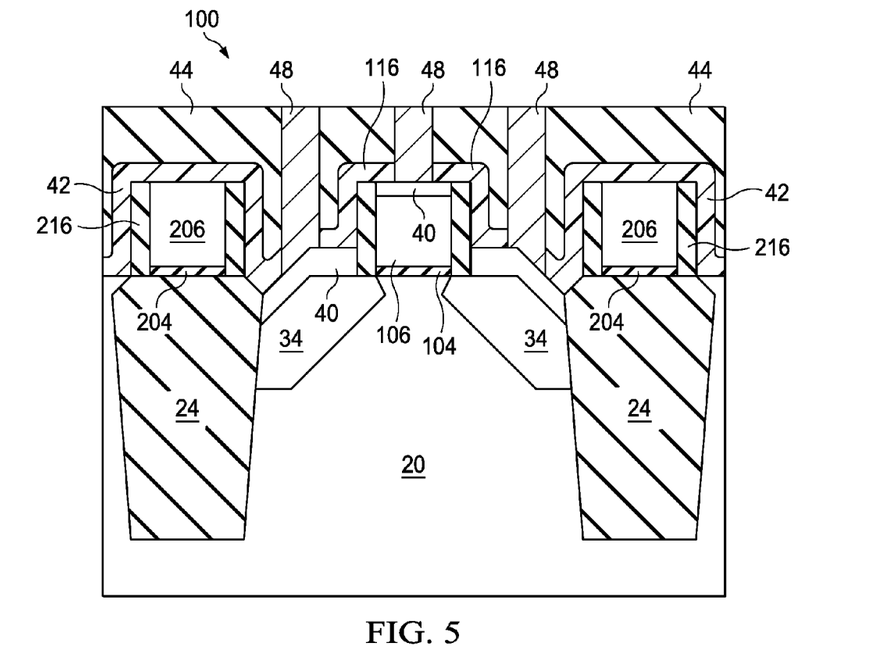

FIG. 5 illustrates the formation of silicide regions 40, Etch Stop Layer (ESL) 42, and contact plugs 48. Source/drain implantation may further be performed to form source/drain regions, which are also illustrated as 34. The formation of MOS device 100 is thus finished. ESL 42 is blanket deposited, for example, using Plasma Enhanced Chemical Vapor Deposition (PECVD), LPCVD, thermal CVD, or the like. Inter-level dielectric (ILD) 44 is deposited next. ILD layer 44 may include boronphospho-silicate glass (BPSG) or other applicable materials. ILD layer 44 provides insulation between MOS device 100 and overlying metal lines. Contact plugs 48 are then formed to provide access to source/drain regions 34 and gate electrode 106 through silicide regions 40.

FIGS. 6A through 14 illustrate top views and cross-sectional views of intermediate stages in the formation of recesses and epitaxy regions in accordance with alternative embodiments. Unless specified otherwise, the materials and formation methods of the components in these embodiments are essentially the same as the like components, which are denoted by like reference numerals in the embodiment shown in FIGS. 1 through 5. The formation details of the embodiment shown in FIGS. 6A through 14 may thus be found in the discussion of the embodiments shown in FIGS. 1 through 5. The initial steps of these embodiments are essentially the same as shown in FIGS. 1 through 2B. In addition, after the steps as in the embodiments shown in FIGS. 6A through 14 are performed, additional steps as the steps shown in FIG. 5 may also be performed.

Figure 6A:
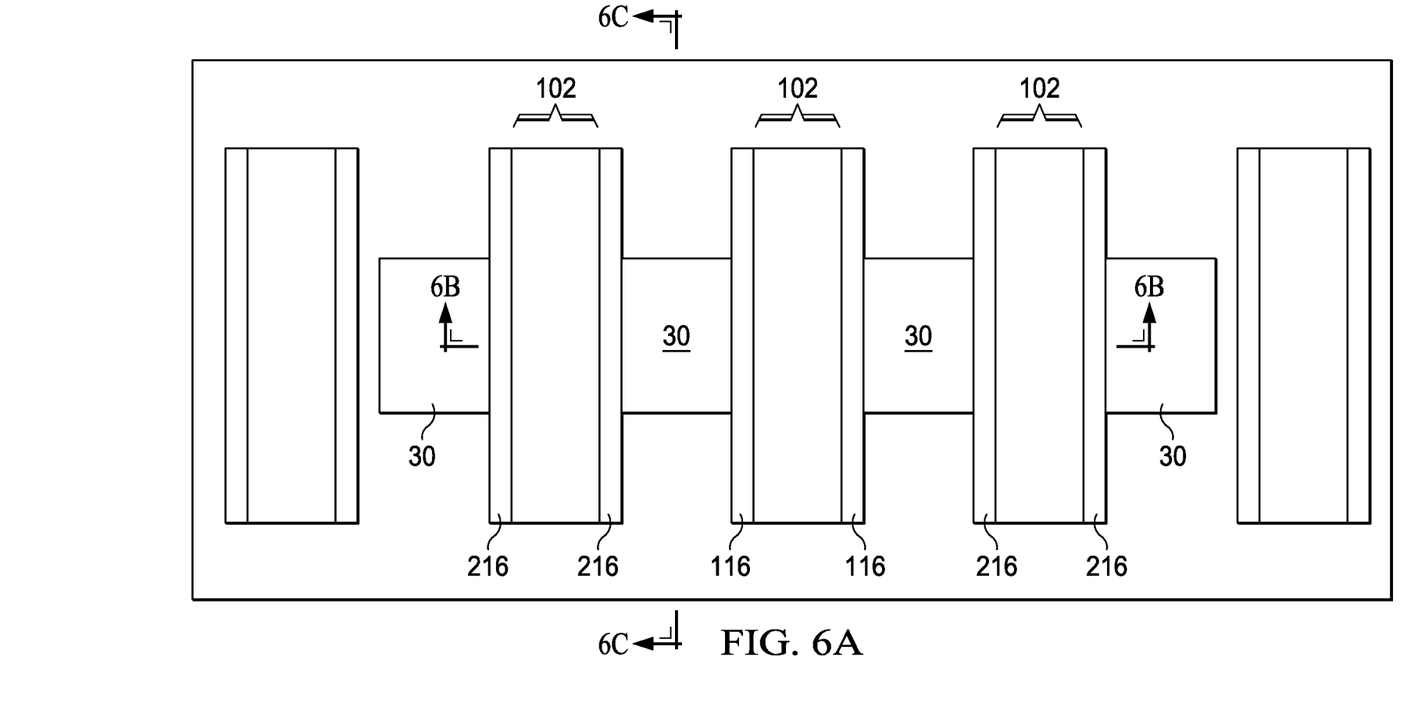
Figure 6B:
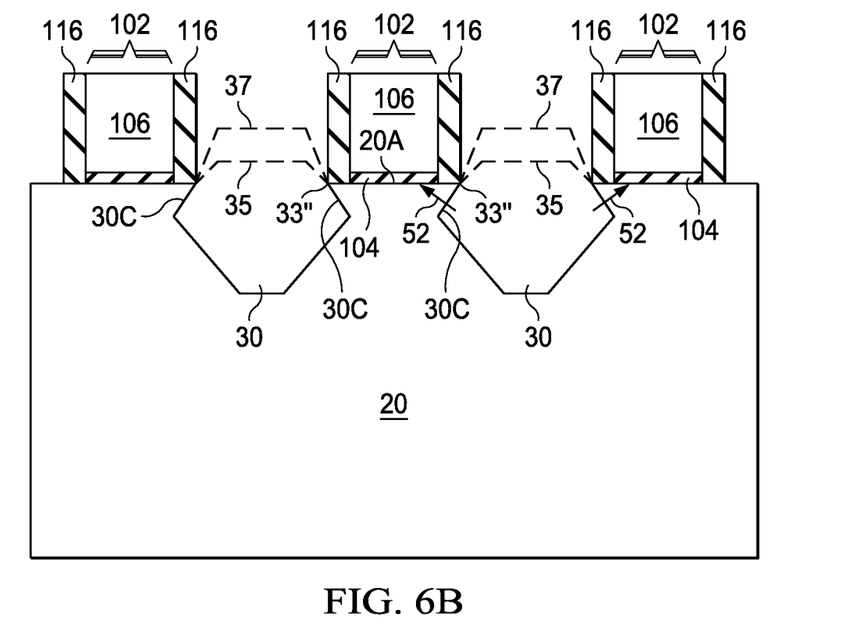
Figure 7:
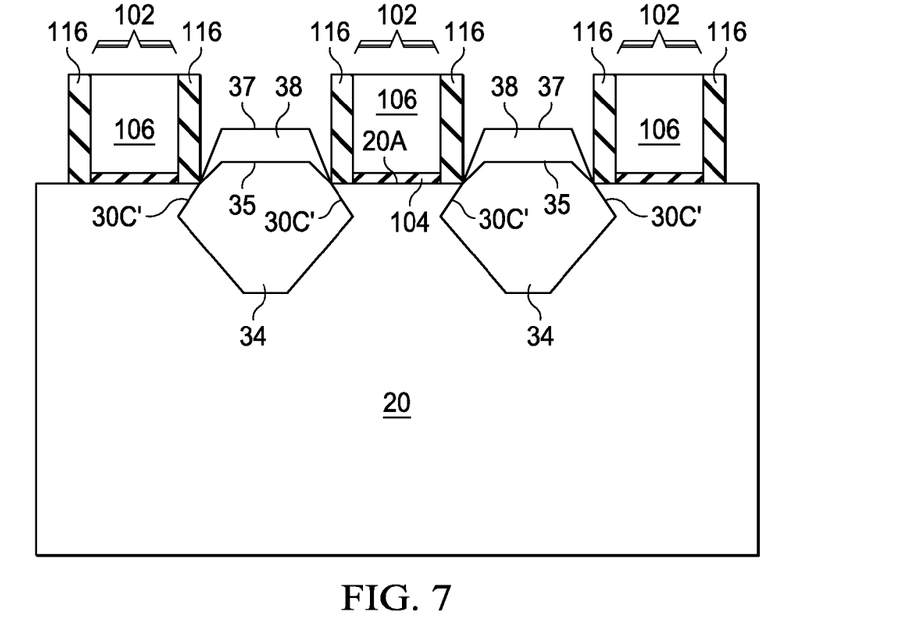

FIG. 6A illustrates a top view of gate stacks 102 and recesses 30 adjacent to gate stacks 102. FIG. 6B illustrates a cross-sectional view obtained from the plane crossing line 6B-6B in FIG. 6A. As shown in FIG. 6B, recesses 30 have spear-head shapes, and exposed surfaces 30C extend to the outer edge of gate spacers 116. Next, as shown in FIG. 7, the enhanced cleaning is performed, wherein the details of the enhanced cleaning are essentially the same as in the embodiments in FIG. 3. As a result, exposed surfaces 30C' are recessed, and are closer to the edges of the respective gate electrodes 106. Arrows 52 in FIG. 6B illustrates the recessing directions of the exposed surface 30C, which illustrates that top points 33'' are close to, and may be substantially aligned to, the respective edges of gate electrode 106.

Figure 6C:
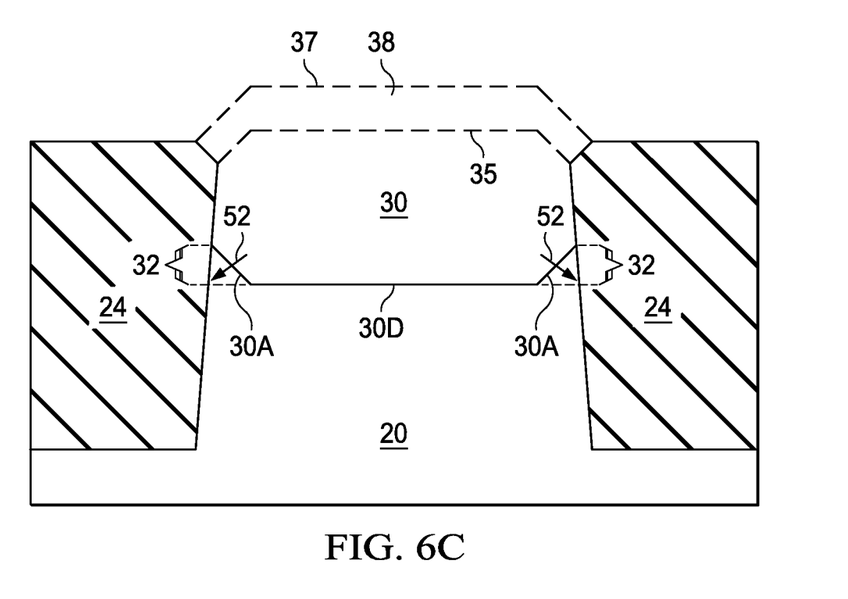

FIG. 6C illustrates a cross-sectional view obtained from the plane crossing line 6C-6C in FIG. 6A. As shown in FIG. 6C, exposed surfaces 30A of silicon substrate 20 in recesses 30 are on, or close to, the (111) planes. This may adversely cause the subsequently formed epitaxy regions and silicon-containing caps (with dashed lines 35 and 37 representing the respective top surfaces) to have undesirable profiles. As a result, silicon-containing cap 38 would have a highly non-uniform thickness. Accordingly, the enhanced cleaning is performed to solve this problem.

Figure 8:
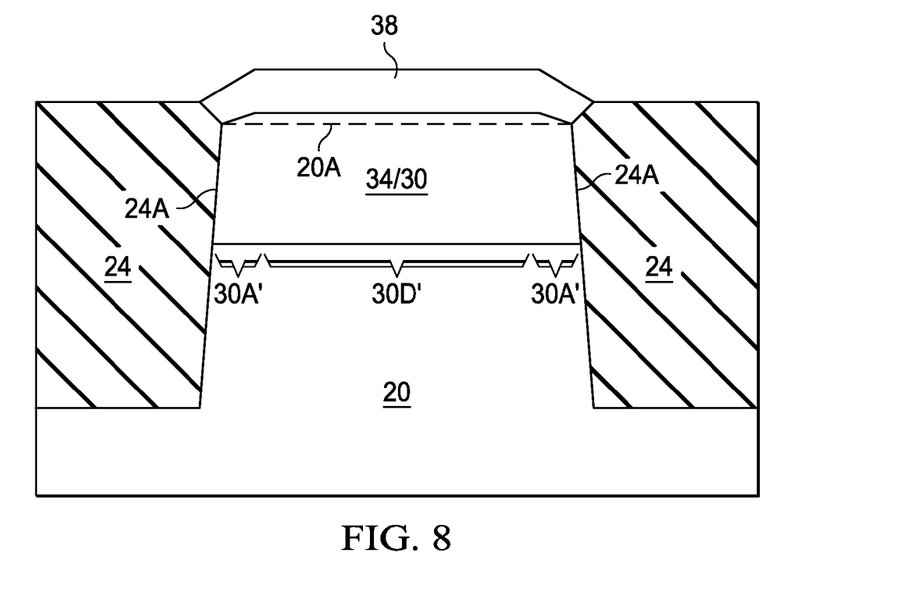

In the enhanced cleaning, silicon portions 32 are etched. Arrows 52 (FIG. 6C) illustrate the directions of the recessing of surfaces 30A of substrate 20. FIG. 8 illustrates the resulting structure after the enhanced cleaning is performed. The resulting surfaces 30A' of substrate 20 are parallel to the original top surface 20A (FIG. 6B) of substrate 20. It is observed that the combined surface, which includes surfaces 30A' and 30D', may be substantially planar. The combined surface is in contact with sidewalls 24A of two neighboring STI regions 24, which sidewalls 24A face each other. Epitaxy regions 34 and the top surfaces of silicon-containing caps 38 are also illustrated. Due to the enhanced cleaning, the thickness of silicon-containing caps 38 is substantially uniform.

Figure 9A:
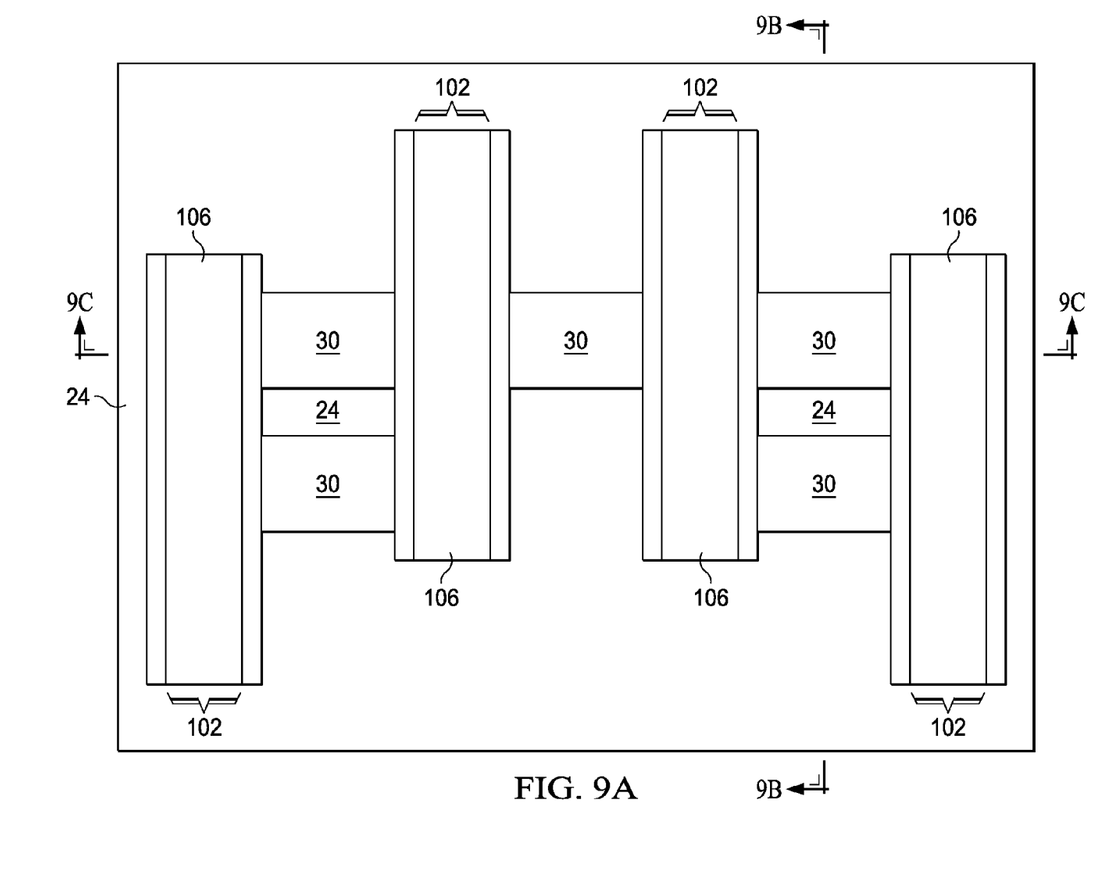
Figure 9B:
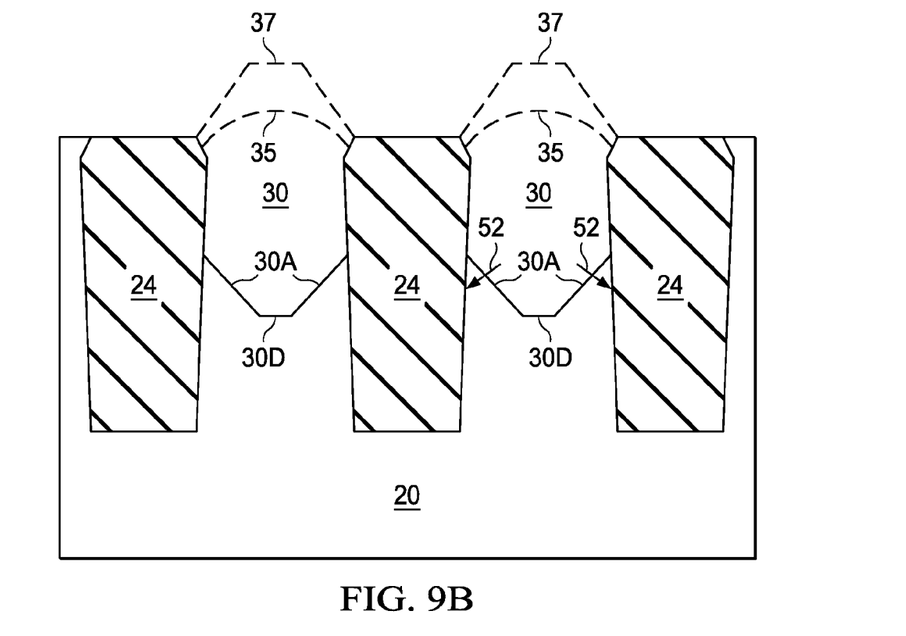
Figure 9C:
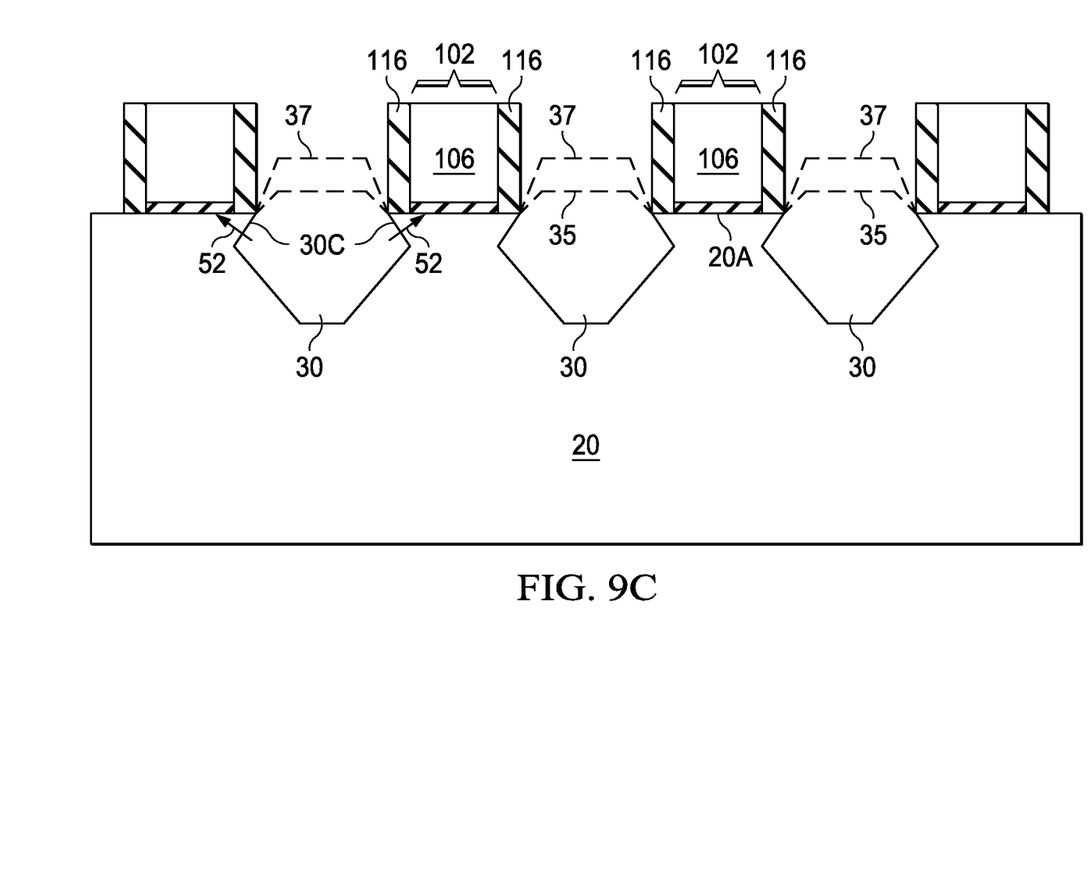
Figure 10:
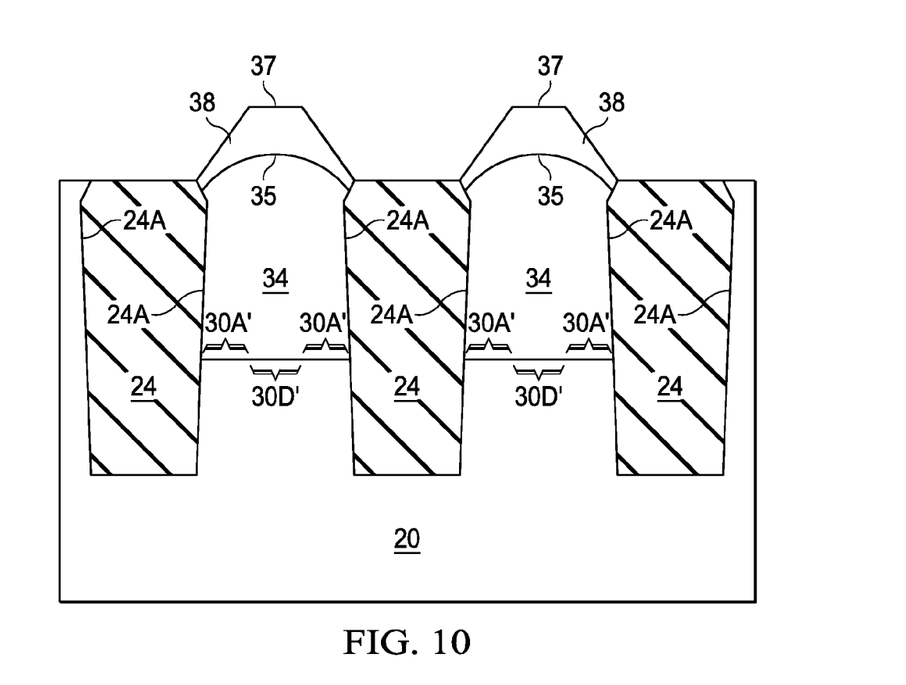

FIGS. 9A through 11 illustrate the top views and cross-sectional views of intermediate stages in the formation of intermediate stages in the formation of a Static Random Access Memory (SRAM) cell. FIG. 9A illustrates the top view of gate stacks 102 and recesses 30 adjacent to gate stacks 102. FIG. 9B illustrates a cross-sectional view obtained from the plane crossing line 9B-9B in FIG. 9A. As shown in FIG. 9B, recesses 30 are between neighboring STI regions 24, and hence each of recesses 30 includes surfaces 30D and surfaces 30A on opposite sides of the corresponding surfaces 30D. Surfaces 30D are parallel to the original top surface 20A (not shown in FIG. 9B, please refer to FIG. 9C) of substrate 20. Surfaces 30A are pinned to, or close to, (111) planes. Next, as shown in FIG. 10, the enhanced cleaning is performed. The resulting exposed surfaces 30A' are parallel to original surface 20A (FIG. 9C) of substrate 20. Surfaces 30A' and 30D' may form a planar surface, wherein surface 30D' are the resulting surfaces recessed from surface 30D. Accordingly, in each of recesses 30, substrate 20 has a substantially planar surface that is parallel to original surface 20A of substrate 20. The planar surface is in contact with the opposite sidewalls 24A of STI regions 24.

Figure 11:
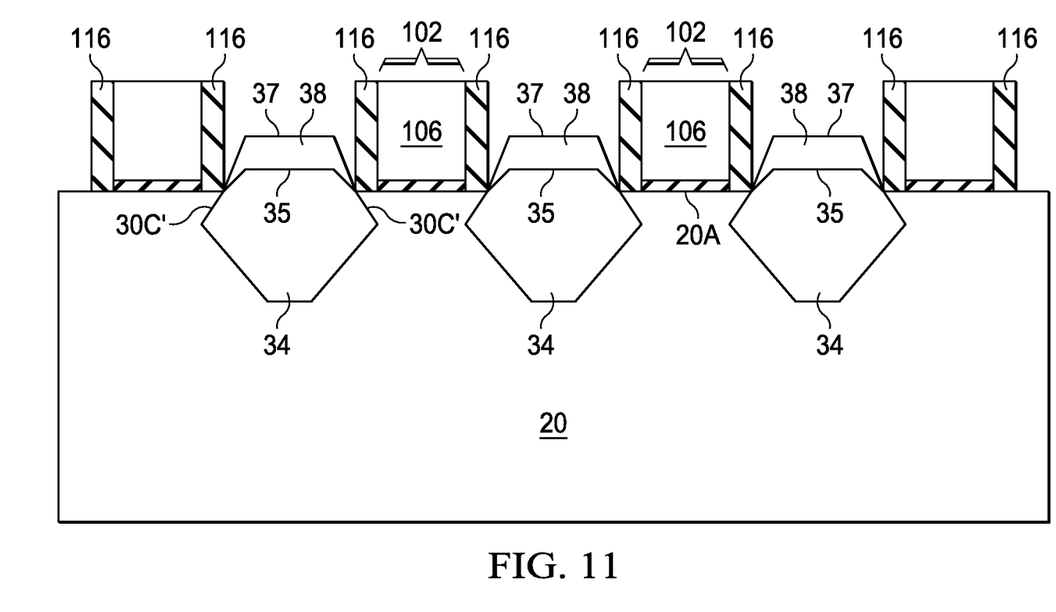

FIG. 9C illustrates a cross-sectional view obtained from the plane crossing line 9C-9C in FIG. 9A. As shown in FIG. 9C, exposed surfaces 30C of silicon substrate 20 in recesses 30 are pinned onto or close to the (111) planes. Next, as shown in FIG. 11, after the enhanced cleaning is performed, surfaces 30C are recessed under the respective gate electrodes 106. Arrows 52 illustrate the direction of the recessing. The resulting surfaces 30C' are illustrated in FIG. 11. Epitaxy regions 34 and the top surfaces of silicon-containing caps 38 are also illustrated. Due to the enhanced cleaning, the thickness of silicon-containing caps 38 is substantially uniform.

Figure 12A:
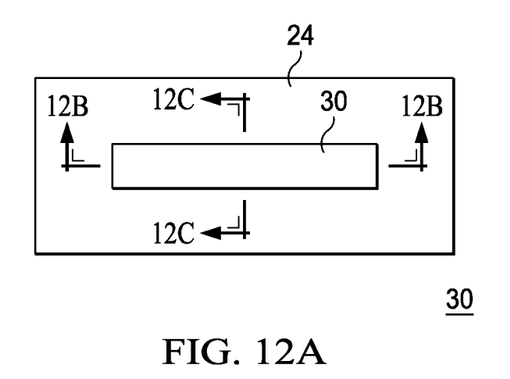
Figure 12B:
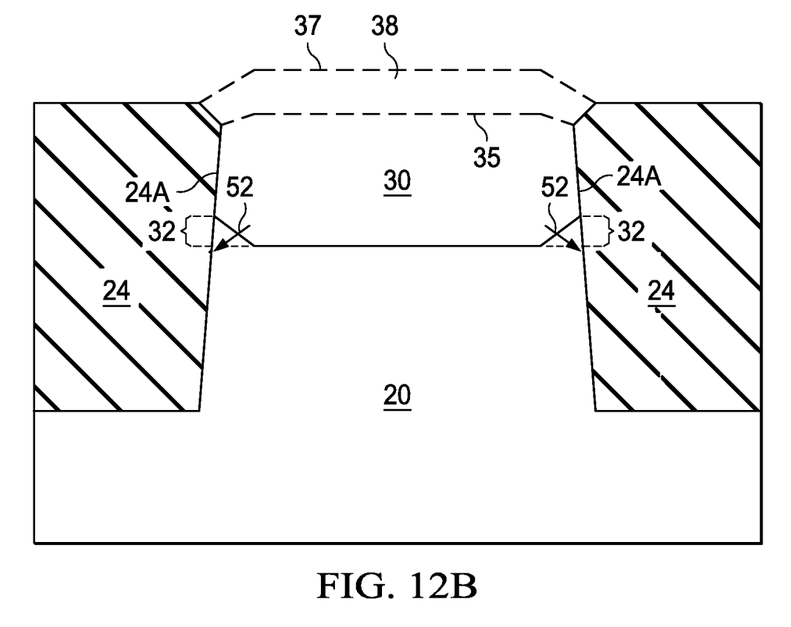
Figure 12C:
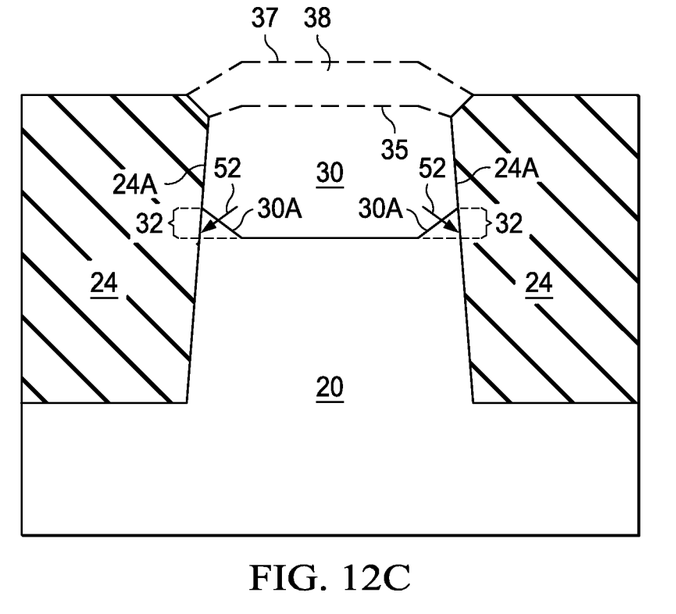
Figure 13:
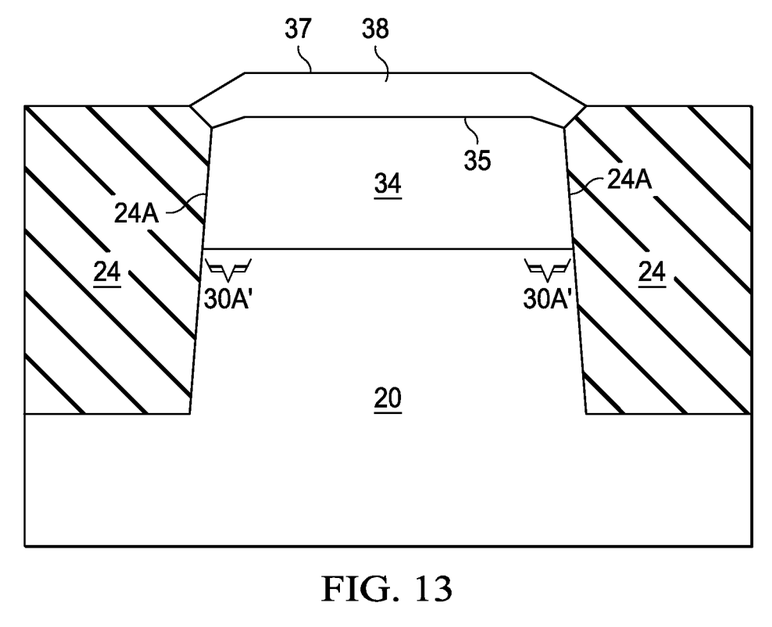
Figure 14:
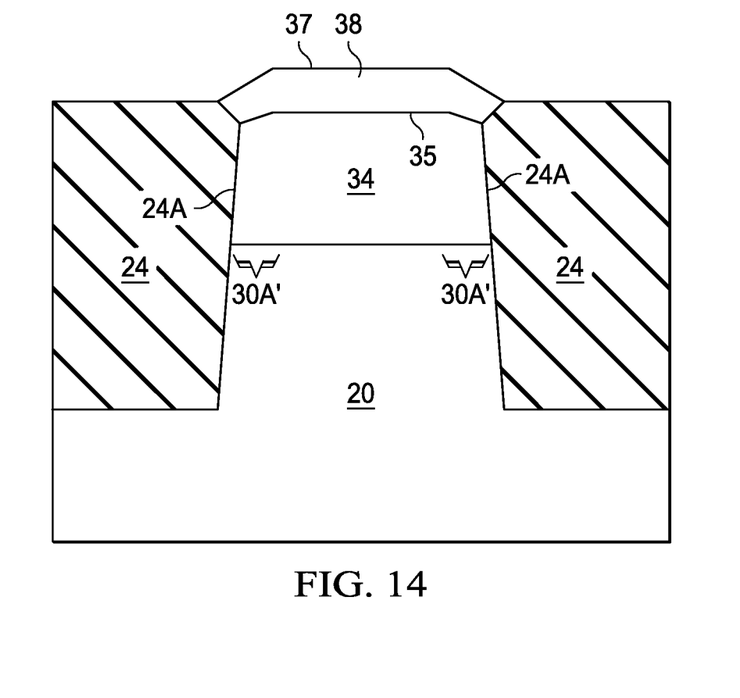

FIGS. 12A through 14 illustrate the top views and cross-sectional views of intermediate stages in the formation of epitaxy strip 34 encircled by STI regions 24. FIGS. 12B and 12C are obtained from the planes 12B-12B and 12C-12C in FIG. 12A, respectively. FIGS. 12B and 12C illustrate recesses 30 before the enhanced cleaning. After the structures as shown in FIGS. 12A through 12C are formed, the enhanced cleaning is performed to enhance the profiles of recesses 30. Next, as shown in FIGS. 13 and 14, epitaxy regions 34 and silicon-containing caps 38 are formed. FIG. 13 is obtained from the structure in FIG. 12B, and FIG. 14 is obtained from the structure in FIG. 12C. As shown in FIGS. 13 and 14, after the enhanced cleaning, the addition silicon portions 32 (FIGS. 12B and 12C) are etched, and the resulting surfaces 30A' are parallel to top surface of substrate 20. The entire bottom surfaces of epitaxy region 34 may be planar.

In accordance with embodiments, a method includes etching a semiconductor substrate to form a recess, wherein the recess extends from a top surface of the semiconductor substrate into the semiconductor substrate. An enhanced cleaning is then performed to etch exposed portions of the semiconductor substrate. The exposed portions are in the recess. The enhanced cleaning is performed using process gases including HCl and germane $GeH_4$. After the enhanced cleaning, an epitaxy is performed to grow a semiconductor region in the recess.

In accordance with other embodiments, a method includes forming a gate stack over a top surface of a semiconductor substrate, and etching a portion of the semiconductor substrate adjacent to the gate stack to form a recess. The recess includes a (111) bottom surface contacting an STI region, with the (111) bottom surface being a surface of a portion of the semiconductor substrate. After the step of etching, an enhanced cleaning is performed on the semiconductor substrate. During the enhanced cleaning, a portion of the semiconductor substrate having the (111) bottom surface is removed to generate a surface parallel to the top surface of a semiconductor substrate. After the enhanced cleaning, an epitaxy is performed to grow a semiconductor region in the recess.

In accordance with yet other embodiments, a method includes etching a semiconductor substrate having a top surface to form a recess in the semiconductor substrate. An enhanced cleaning is performed in a process chamber to etch a portion of the semiconductor substrate. The portion of the semiconductor substrate is in the recess. The enhanced cleaning is performed using process gases including HCl and GeH$_4$. After the enhanced cleaning, an epitaxy is performed to grow a semiconductor region in the recess, wherein the epitaxy is in-situ performed in the process chamber.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    etching a semiconductor substrate to form a recess using a wet etch, with exposed surfaces of the semiconductor substrate in the recess comprising a first (111) bottom surface and a second (111) bottom surface in physical contact with the first (111) bottom surface, wherein the recess extends from a top surface of the semiconductor substrate into the semiconductor substrate;
    after the wet etch, performing an enhanced cleaning to etch exposed portions of the semiconductor substrate, with the enhanced cleaning being performed using a dry etch, wherein the exposed portions are in the recess, and wherein the enhanced cleaning is performed using process gases comprising hydrochloride (HCl) and germane (GeH$_4$); and
    after the enhanced cleaning, performing an epitaxy to grow a semiconductor region in the recess.

2. The method of claim 1, wherein the enhanced cleaning comprises an etching and a deposition simultaneously, and wherein the enhanced cleaning has a net effect of etching.

3. The method of claim 1 further comprising a Shallow Trench Isolation (STI) region extending into the semiconductor substrate, wherein the first (111) bottom surface contacts the STI region, and wherein the first (111) bottom surface is removed by the dry etch, and a bottom surface of the recess parallel to the top surface of the semiconductor substrate is generated by the dry etch.

4. The method of claim 1, wherein the enhanced cleaning and the epitaxy are in-situ performed in a same process chamber.

5. The method of claim 1, wherein the process gases for the enhanced cleaning further comprises a process gas selected from the group consisting essentially of Dichloro-Silane (DCS), silane (SiH$_4$), methylsilane (SiCH$_6$), and combinations thereof.

6. The method of claim 1 further comprising:
    forming a gate dielectric over the semiconductor substrate;
    forming a gate electrode over the gate dielectric; and
    forming a gate spacer on a sidewall of the gate electrode, wherein the gate spacer comprises a first sidewall contacting the gate electrode, and a second sidewall opposite to the first sidewall, and wherein the enhanced etching results in the recess to extend from the second sidewall to the first sidewall of the gate spacer, wherein the enhanced etching results in the recess to extend from the second sidewall to the first sidewall of the gate spacer.

7. The method of claim 1, wherein the recess is between opposite sidewalls of two Shallow Trench Isolation (STI) Regions, wherein after the enhanced cleaning, substantially an entirety of bottom surface of the recess is planar, and is parallel to the top surface of the semiconductor substrate.

8. A method comprising:
    forming a gate stack over a top surface of a semiconductor substrate;
    etching a portion of the semiconductor substrate adjacent to the gate stack using wet etch to form a recess, wherein the recess comprises a (111) bottom surface contacting a Shallow Trench Isolation (STI) region, with the (111) bottom surface being a surface of a portion of the semiconductor substrate;
    during the etching the portion of the semiconductor substrate, simultaneously etching an addition portion of the semiconductor substrate between opposite sidewalls of two STI regions to form an additional recess, wherein the opposite sidewalls are exposed to the additional recess, and wherein the semiconductor substrate comprises an additional (111) bottom surface in the additional recess;
    after the step of etching, performing an enhanced cleaning on the semiconductor substrate using dry etch, wherein during the enhanced cleaning, a portion of the semiconductor substrate having the (111) bottom surface is removed to generate a surface parallel to the top surface of the semiconductor substrate, wherein after the enhanced cleaning, substantially an entirety of the additional (111) bottom surface of the additional recess is planar and parallel to the top surface of the semiconductor substrate, and wherein the entirety of the additional (111) bottom surface is an integrated surface that continuously extends from a first one to a second one of the two STI regions; and
    after the enhanced cleaning, performing an epitaxy to grow a semiconductor region in the recess.

9. The method of claim 8, wherein the enhanced cleaning is performed using process gases comprising hydrochloride (HCl) and germane (GeH$_4$).

10. The method of claim 9, wherein the process gases for the enhanced cleaning further comprises a process gas selected from the group consisting essentially of Dichloro-Silane (DCS), silane (SiH$_4$), methylsilane (SiCH$_6$), and combinations thereof.

11. The method of claim 8, wherein the enhanced cleaning and the epitaxy are in-situ performed in a same process chamber.

12. The method of claim 8, wherein the enhanced cleaning is performed in a process chamber configured to perform a Low-Pressure Chemical Vapor Deposition (LPCVD).

13. A method comprising:
forming a gate dielectric over a semiconductor substrate, wherein the semiconductor substrate comprises a top surface;
forming a gate electrode over the gate dielectric;
forming a gate spacer on a sidewall of the gate electrode, wherein the gate spacer comprises a first sidewall contacting the gate electrode, and a second sidewall opposite to the first sidewall;
etching a semiconductor substrate to form a recess in the semiconductor substrate using a wet etch, wherein surfaces of the semiconductor substrate in the recess comprise a first (111) bottom surface and a second (111) bottom surface joined to the first (111) bottom surface;
performing an enhanced cleaning in a process chamber to etch a portion of the semiconductor substrate using a dry etch, wherein the portion of the semiconductor substrate is in the recess, wherein the first (111) bottom surface is removed by the dry etch to generate a planar bottom surface parallel to the top surface of the semiconductor substrate, and the enhanced cleaning results in the recess to extend from the second sidewall to the first sidewall of the gate spacer; and
after the enhanced cleaning, performing an epitaxy to grow a semiconductor region in the recess, wherein the epitaxy is in-situ performed in the process chamber.

14. The method of claim 13, wherein process gases for the enhanced cleaning further comprises a process gas selected from the group consisting essentially of Dichloro-Silane (DCS), silane ($SiH_4$), methylsilane ($SiCH_6$), and combinations thereof.

15. The method of claim 14, wherein the enhanced cleaning is performed with a first Etching-to-Growth (E/G) ratio, wherein the epitaxy is performed with a second E/G ratio, and wherein the first and the second E/G ratios are calculated using an equation:

$$E/G = FR_{HCl}/(FR_{DCS} + 100 \times FR_{GeH4})$$

wherein $FR_{HCl}$, $FR_{DCS}$, and $FR_{GeH4}$ are flow rates of HCl, DCS, and $GeH_4$, respectively, and wherein the first E/G ratio is greater than 1, and the second E/G ratio is lower than 1.

16. The method of claim 15, wherein the first E/G ratio is greater than about 1.5.

17. The method of claim 13, wherein the second (111) bottom surface is removed by the dry etch to generate the planar bottom surface parallel to the top surface of the semiconductor substrate.

18. The method of claim 13, wherein the recess is between two opposite Shallow Trench Isolation (STI) regions, and wherein after the dry etch, opposite ends of the planar bottom surface are in contact with the opposite STI regions.

19. The method of claim 1, wherein after the wet etch and before the dry etch, no substantial planar surface parallel to the top surface of the semiconductor substrate exists between the first (111) bottom surface and the second (111) bottom surface.

20. The method of claim 13, wherein after the wet etch and before the dry etch, no substantial planar surface parallel to the top surface of the semiconductor substrate exists between the first (111) bottom surface and the second (111) bottom surface.

* * * * *